(12) United States Patent
Imai et al.

(10) Patent No.: US 9,013,047 B2
(45) Date of Patent: Apr. 21, 2015

(54) SEMICONDUCTOR DEVICE

(71) Applicants: Makoto Imai, Toyota (JP); Toru Tanaka, Nagoya (JP)

(72) Inventors: Makoto Imai, Toyota (JP); Toru Tanaka, Nagoya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 36 days.

(21) Appl. No.: 14/056,148

(22) Filed: Oct. 17, 2013

(65) Prior Publication Data

US 2014/0131845 A1 May 15, 2014

(30) Foreign Application Priority Data

Nov. 14, 2012 (JP) ................................. 2012-249971

(51) Int. Cl.
*H01L 23/495* (2006.01)
*H01L 23/00* (2006.01)
*H01L 23/31* (2006.01)

(52) U.S. Cl.
CPC .......... *H01L 23/49589* (2013.01); *H01L 24/33* (2013.01); *H01L 23/3135* (2013.01); *H01L 23/315* (2013.01); *H01L 23/49562* (2013.01); *H01L 23/3107* (2013.01)

(58) Field of Classification Search
USPC .................. 257/666, 787, E23.085, E23.052; 361/760, 777
See application file for complete search history.

(56) References Cited

U.S. PATENT DOCUMENTS

| 7,551,455 | B2 * | 6/2009 | Chen et al. .................... 361/777 |
| 8,102,040 | B2 * | 1/2012 | Chow et al. ................... 257/686 |
| 2006/0139902 | A1 * | 6/2006 | Happoya ....................... 361/760 |
| 2008/0192437 | A1 | 8/2008 | Furuta | |
| 2009/0086457 | A1 | 4/2009 | Motegi et al. | |
| 2012/0147641 | A1 | 6/2012 | Yamaguchi et al. | |

FOREIGN PATENT DOCUMENTS

| JP | 2001-210758 A | 8/2001 |
| JP | 2003-289129 | 10/2003 |
| JP | 2006-303455 | 11/2006 |
| JP | 2009-81279 A | 4/2009 |
| JP | 2009-135279 A | 6/2009 |
| JP | 2010-56206 | 3/2010 |
| JP | 2012-129309 | 7/2012 |

* cited by examiner

*Primary Examiner* — Roy Potter
(74) *Attorney, Agent, or Firm* — Oblon, McClelland, Maier & Neustadt, L.L.P.

(57) ABSTRACT

A semiconductor device includes a semiconductor element, a capacitor, a first resin, lead frames and a second resin. The first resin forms a resin molding which covers the semiconductor element and the capacitor. The lead frames are attached to two surfaces of the resin molding and are connected to the semiconductor element and the capacitor. The second resin directly covers the capacitor and has a rigidity lower than a rigidity of the first resin. An outside of the second resin is directly covered with the first resin.

15 Claims, 3 Drawing Sheets

SEMICONDUCTOR DEVICE

INCORPORATION BY REFERENCE

The disclosure of Japanese Patent Application No. 2012-249971 filed on Nov. 14, 2012 including the specification, drawings and abstract is incorporated herein by reference in its entirety.

BACKGROUND OF THE INVENTION

1. Field of the Invention

The invention relates to a semiconductor device. In particular, the invention relates to a semiconductor device in which a semiconductor element and a capacitor are both embedded in a resin molding.

2. Description of Related Art

Semiconductor packages (semiconductor devices) in which semiconductor elements that deal with large currents are covered with a resin molding are sometimes used as voltage converters and inverters for driving traction motors of electric motor vehicles (Japanese Patent Application Publication No. 2010-056206 (JP 2010-056206 A), Japanese Patent Application Publication No. 2006-303455 (JP 2006-303455 A), Japanese Patent Application Publication No. 2012-129309 (JP 2012-129309 A) and Japanese Patent Application Publication No. 2003-289129 (JP 2003-289129 A)). Semiconductor devices are sometimes termed semiconductor cards or semiconductor modules. Typically, the aforementioned semiconductor elements are transistors that are used in switching circuits. A resin molding is molded by injecting resin into a mold. In the mold, an assembly made up of a semiconductor element, lead frames, and so on has been disposed. The lead frames made of metal plates are disposed on two opposite surfaces of the resin molding. The semiconductor element within the molding is electrically connected to each lead frame. The lead frames correspond to terminals that are electrically connected to the semiconductor element, that is, correspond to electrode plates. Therefore, the term "lead frame" may be reworded simply as "electrode plate". Furthermore, for physical connection (joint) between the lead frames and the semiconductor element, a solder material is typically used.

There is known a structure in which a cooler is placed abutting, via an intervening insulator plate, each of lead frames constituting two opposite surfaces of a semiconductor package so as to efficiently cool the semiconductor device. The lead frames provided on the two opposite surfaces of the resin molding also serve as heat radiating plates that diffuse heat from the semiconductor element. Furthermore, the semiconductor element is covered with the resin molding in order to protect the semiconductor element from external dust or moisture and to restrain fatigue degradation of the solder material that joins the semiconductor element and the lead frames. The semiconductor element and the lead frames are different in coefficient of thermal expansion. Therefore, when the semiconductor element produces heat, the semiconductor element and the lead frame that are in contact with the two opposite surfaces of the solder material expand with different coefficients of expansion, so that stress occurs in the solder material. Stress occurs repeatedly in every cycle of heat production, which causes fatigue degradation. A portion of each lead frame is embedded in resin. By covering the semiconductor element and the lead frames with the resin molding, deformation of the semiconductor element and the lead frames is restrained, and stress that occurs in the solder material is restrained, and fatigue degradation of the solder material is restrained.

Sometimes, in a semiconductor package, a capacitor is covered with a molding together with a transistor. The capacitor is connected in parallel with the transistor in order to lessen the surge current to the transistor. In any one of the semiconductor devices disclosed in JP 2010-056206 A, JP 2006-303455 A, JP 2012-129309 A and JP 2003-289129 A, a capacitor and a transistor are covered with a molding.

The transistors that are higher in heat resistance and higher in speed are demanded. Concretely, a SiC (silicon carbide)-based MOS transistor that is more excellent in heat resistance and responsiveness than conventional IGBTs is considered promising. Accordingly, the capacitors are required to have high heat resistance and high responsiveness. As a capacitor excellent in heat resistance and responsiveness, a ceramic capacitor is considered promising. However, the ceramic capacitors have a drawback of being hard and being apt to break easily. Thus, there is a possibility that if a ceramic capacitor is covered with a resin mold together with a transistor, the different thermal expansion coefficients of the resin and the ceramic capacitor cause stress to concentrate in the ceramic capacitor, so that the ceramic capacitor is apt to break easily.

SUMMARY OF THE INVENTION

The invention provides a technology that lessens the stress that occurs in a capacitor in a semiconductor device in which the capacitor and a semiconductor element are covered with a resin molding.

A semiconductor device as a first aspect of the invention has a semiconductor element, a capacitor, a first resin, lead frames and a second resin, The first resin forms a resin molding which covers the semiconductor element and the capacitor. The lead frames are attached to two surfaces of the resin molding and are connected to the semiconductor element and the capacitor. The second resin directly covers the capacitor and has a rigidity lower than a rigidity of the first resin. An outside of the second resin is directly covered with the first resin. This construction reduces the load that the capacitor receives from its surrounding as the capacitor thermally expands and shrinks, and therefore lessens the stress that occurs within the capacitor.

A semiconductor device as a second aspect of the invention has a semiconductor element, a capacitor, a first resin and lead frames. The first resin forms a resin molding which covers the semiconductor element and the capacitor. The lead frames are attached to two surfaces of the resin molding and are connected to the semiconductor element and the capacitor. A space is defined between the first resin and the capacitor.

A semiconductor device as a third aspect of the invention has a semiconductor element, a capacitor, a first resin and lead frames. The first resin forms a resin molding. The resin molding covers the semiconductor element and the capacitor and is apart from the capacitor. The lead frames are attached to two surfaces of the resin molding and are connected to the semiconductor element and the capacitor.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
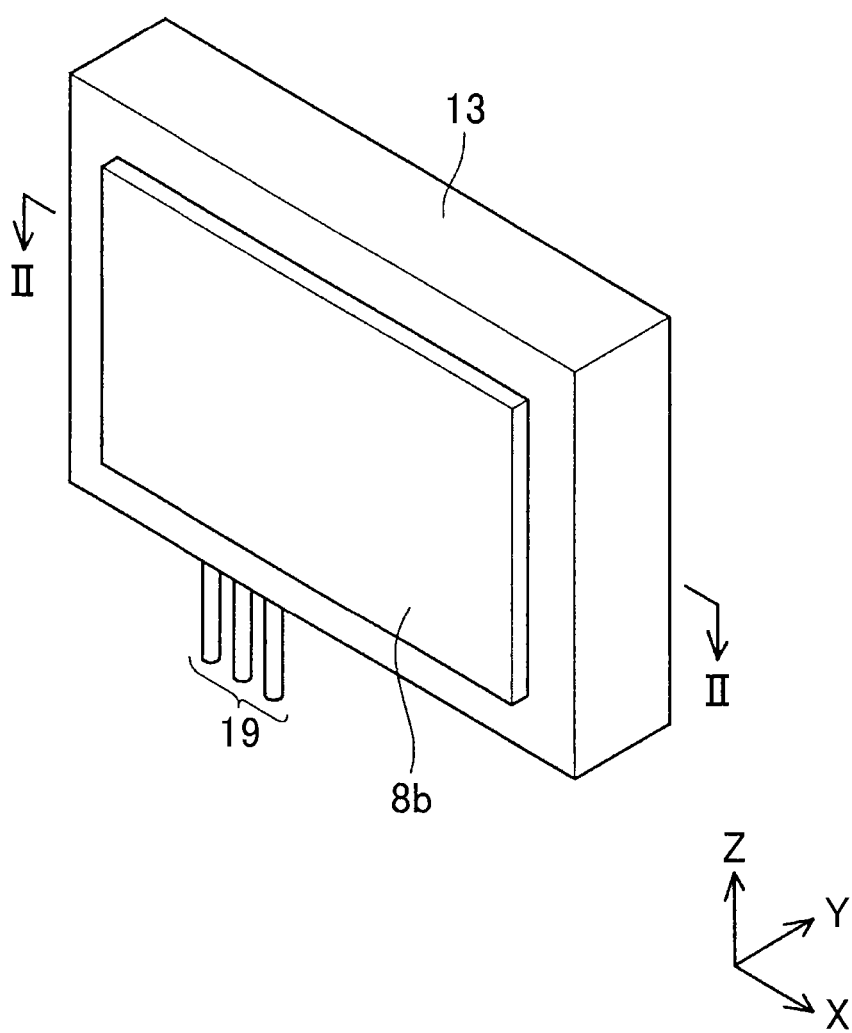
FIG. 1 is a schematic perspective view of a semiconductor device in accordance with a first embodiment of the invention.
Figure 2:
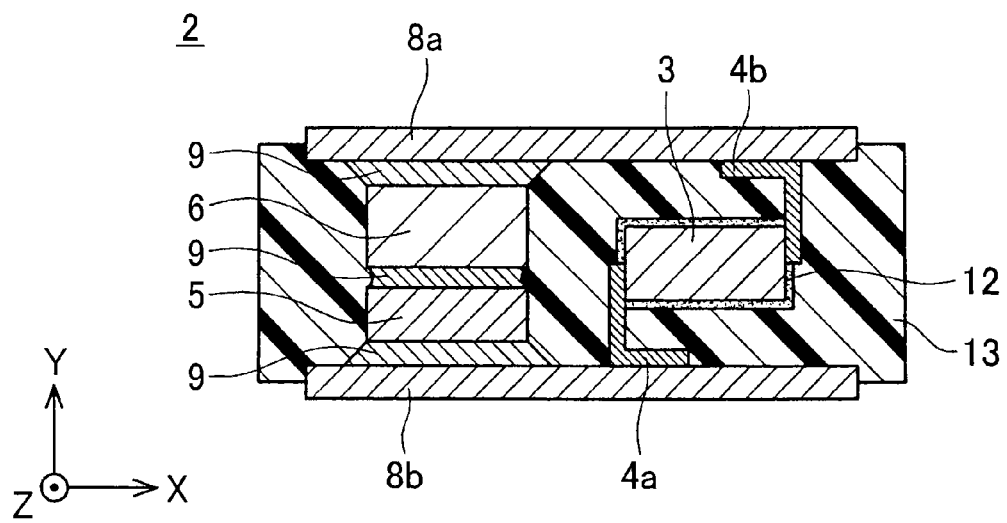
FIG. 2 is a sectional view taken in a plane as indicated by arrowed lines II, II in FIG. 1.

FIG. 1 shows a schematic perspective view of a semiconductor device 2 in accordance with a first embodiment of the invention FIG. 2 shows a sectional view taken in a plane as indicated by arrows II, II in FIG. 1. A semiconductor device 2 is used in, for example, a switching circuit of an inverter that supplies current to a traction motor of an electric motor vehicle. The semiconductor device 2 has a construction in which a transistor 5 (semiconductor element) and a capacitor 3 are covered with a resin molding. The transistor 5 is a metal oxide semiconductor (MOS) transistor that employs an SiC substrate, and is excellent in heat resistance and in responsiveness. The capacitor 3 is a ceramic capacitor that is excellent in heat resistance and responsiveness. The entire resin that covers the transistor 5 and the capacitor 3 is termed resin molding 13. The resin molding 13 is molded in a rectangular parallelepiped shape. The two largest-area surfaces of the resin molding 13 are provided with lead frames 8a, 8b (electrode plates) fixed thereto. As best shown in FIG. 2, a half of each of the lead frames 8a, 8b in the thickness direction is embedded in the resin molding 13. The lead frames 8a, 8b are made of a conductor (metal), and are connected to an emitter and a collector (the drain and the source) of the transistor 5. The lead frames 8a, 8b correspond to the electrode terminals of the transistor 5. Furthermore, control electrodes 19 of the transistor 5 extend out of the resin molding 13. Large currents flow through the lead frames 8a, 8b connected to the emitter and the collector. Therefore, large-area metal plates are used for these electrodes. On the other hand, the control electrodes 19 connected to a gate of the transistor 5 are made of thin metal wires because large current does not flow through the control electrodes 19.

As shown in FIG. 2, One of surfaces of the transistor 5 is connected to the lead frame 8b via a solder material 9. The one of the surfaces corresponds to the emitter (or the collector). The other one of the surfaces of the transistor 5 is connected to the lead frame 8a via the solder material 9 and a metal spacer 6. The other one of the surfaces corresponds to the collector (or the emitter). The metal spacer 6 is inserted to fill in a gap between the transistor 5 and the lead frame 8a because the thickness of the resin molding 13 is relatively larger than the thickness of the transistor 5.

The surrounding area of the capacitor 3 is covered by a low-rigidity resin 12. The low-rigidity resin 12 will be described later. The capacitor 3 is connected to the two lead frames 8a, 8b (electrode plates) via metal plates 4a, 4b, respectively. The metal plates 4a, 4b serve as electric conductors that electrically connect two terminals of the capacitor 3 to the lead frames 8a, 8b, respectively. Furthermore, the metal plates 4a, 4b serve as metal pieces that hold the capacitor 3 between the lead frames 8a, 8b before the capacitor 3 is covered with the resin molding. As is apparent from FIG. 2, the capacitor 3 is connected in parallel, in terms of circuit connection, between the emitter and the collector of the transistor 5. The capacitor 3 is provided for the purpose of lessening the surge current that enters the transistor 5.

The low-rigidity resin 12 that covers the capacitor 3 is, for example, a silicon resin. the rigidity of the low-rigidity resin 12 is lower than the rigidity of the resin that forms the resin molding 13. The resin that forms the resin molding 13 is, for example, an epoxy-base resin. Furthermore, the thickness of the low-rigidity resin 12 is several micrometers to several ten micrometers. The resin that forms the resin molding 13 is an example of the aforementioned first resin, and the low-rigidity resin 12 is an example of the aforementioned second resin. Next, functions of the resin of the resin molding 13 and the low-rigidity resin 12 will be described.

The resin molding 13 is an insulator, and insulates the transistor 5 and the capacitor 3 from their surroundings, and protects these elements from dust. Furthermore, the resin molding 13 lessens the stress that occurs in the solder material 9 due to a difference in thermal expansion coefficient between the transistor 5 and the lead frames 8a, 8b. This can be explained as follows. The transistor 5 and the lead frames 8a, 8b differ in thermal expansion coefficient. The resin molding 13 directly covers the transistor 5, and covers portions of the lead frames 8a, 8b. More precisely, the resin molding 13 covers the lead frames 8a, 8b in such a manner as to surround the solder material 9 that are joined to the lead frames 8a, 8b. The resin molding 13 restrains expansion and shrinkage of the transistor 5 and the lead frames 8a, 8b. Therefore, the difference in strain between the transistor 5 and the lead frames 8a, 8b is lessened, so that the strain (therefore, stress) that occurs in the solder material that joins the transistor 5 and the lead frames 8a, 8b is restrained.

The casing of the transistor 5 is made of, for example, a resin, and the casing of the capacitor 3 is made of a ceramic material. Ceramics are very high in rigidity, and easily break when subjected to stress. In the semiconductor device 2, the capacitor 3 is covered with the resin 12 (the second resin) that is lower in rigidity than the resin (the first resin) of the resin molding 13. Therefore, the restraint of the resin 12 with respect to thermal expansion and shrinkage of the capacitor 3 is weaker than the case where the capacitor 3 is covered with the resin molding 13. In other words, in comparison with the resin molding 13, the stress which, when the capacitor 3 expands and shrinks, the surrounding surfaces of the capacitor 3 receive from the material surrounding the capacitor 3 is decreased. Therefore, covering the capacitor 3 with the low-rigidity resin 12 (the second resin) can make the capacitor 3 less apt to break than covering the capacitor 3 directly with the resin of the resin molding 13 (the first resin). The ceramic capacitor has a structure in which an insulator (ceramic material) and a dielectric are alternately layered. Therefore, there is a possibility that a short circuit between the two electrodes occurs due to breakage of the insulation therebetween when the ceramic capacitor breaks. Hence, it is important to reduce the possibility of breakage of the ceramic capacitor. Incidentally, since the strain of the capacitor 3 due to heat is in the order of several micrometers to several ten micrometers, the thickness of the low-rigidity resin 12 that covers the capacitor 3 may be in the order of several micrometers to several ten micrometers as well.

In the first embodiment, the low-rigidity resin 12 is a silicon resin. The low-rigidity resin 12 may be a resin that is lower in rigidity than the first resin that forms the resin molding 13 (typically, the first resin is an epoxy resin). Besides the silicon resin, the low-rigidity resin 12 may be a fluororesin, a polyvinyl chloride (PVC) resin, etc.

Next, a fabrication process of the semiconductor device 2 will be described. Firstly, the transistor 5 and the metal spacer 6 are soldered between the two lead frames 8a, 8b. Furthermore, the capacitor 3 is fixed in the space between the two lead frames 8a, 8b via the metal plates 4a, 4b. The capacitor 3 is coated beforehand with the low-rigidity resin 12. The fixation of the metal plates 4a, 4b to the capacitor 3 may also be accomplished by soldering. Furthermore, the joint between the metal plates 4a, 4b and the lead frames 8a, 8b, respectively, may also be accomplished by soldering. Incidentally, in FIG. 2, the solder material for fixing the metal plates 4a, 4b is omitted from the illustration.

Since the transistor 5, the metal spacer 6, the capacitor 3 and the metal plates 4a, 4b are fixed to the lead frames 8a, 8b by soldering, the shapes of these components are maintained. This assembly is placed in a mold, and resin is injected into a space surrounding the assembly so that the resin molding 13 are molded integrally with the assembly. In this manner, the semiconductor device 2 that is constituted by a resin molding as a whole is prepared.

Figure 3:
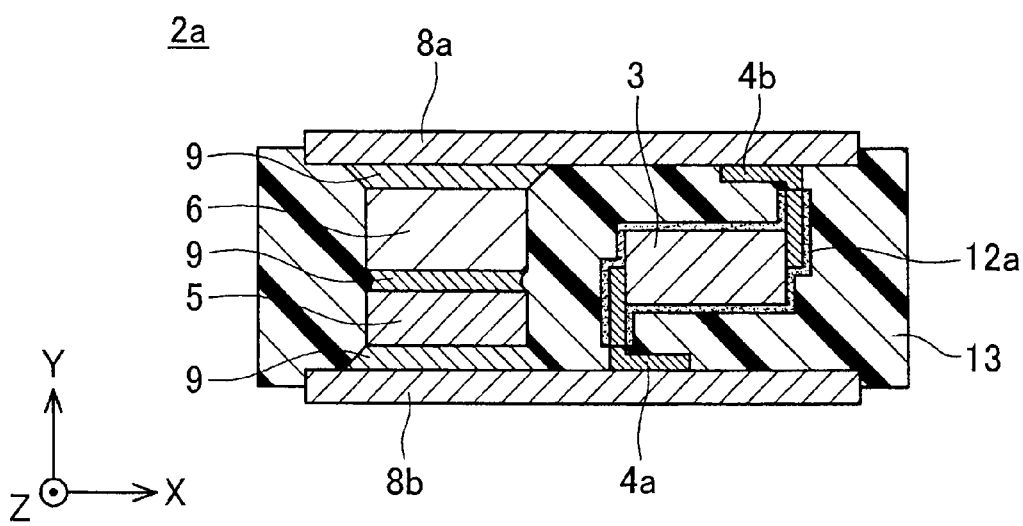
FIG. 3 is a sectional view of a semiconductor device in accordance with a second embodiment of the invention.

Next, a semiconductor device 2a in accordance with a second embodiment of the invention will be described. FIG. 3 is a sectional view of the semiconductor device 2a. The section shown in FIG. 3 corresponds to the section shown in FIG. 2. The semiconductor device 2a has substantially the same basic construction as the semiconductor device 2 of the first embodiment. On the other hand, the semiconductor device 2a is different from the semiconductor device 2 in that a low-rigidity resin 12a also covers a portion of each of the metal plates 4a, 4b. The low-rigidity resin 12a covers not only the capacitor 3 but also portions of the metal plates 4a, 4b, the other portions including areas which extend from the joining portions between the capacitor 3 and the metal plates 4a, 4b to intermediate portions of the metal plates 4a, 4b. Each of the intermediate portions is disposed at a position between one of the joining portions and corresponding one of the lead frames 8a, 8b. In the semiconductor device 2a, the metal plates 4a, 4b, which support the capacitor 3, are covered (partially) with the low-rigidity resin 12a, thereby allowing the metal plates 4a, 4b to more easily moving (or more easily be displaced). That is, as the capacitor 3 thermally expands and shrinks, distal ends of the metal plates 4a, 4b supporting the capacitor 3 move. However, the stress that occurs in association with movements of the metal plates 4a, 4b is lessened by the low-rigidity resin 12a. Consequently, the stress that occurs in the capacitor 3 is further reduced.

Figure 4:
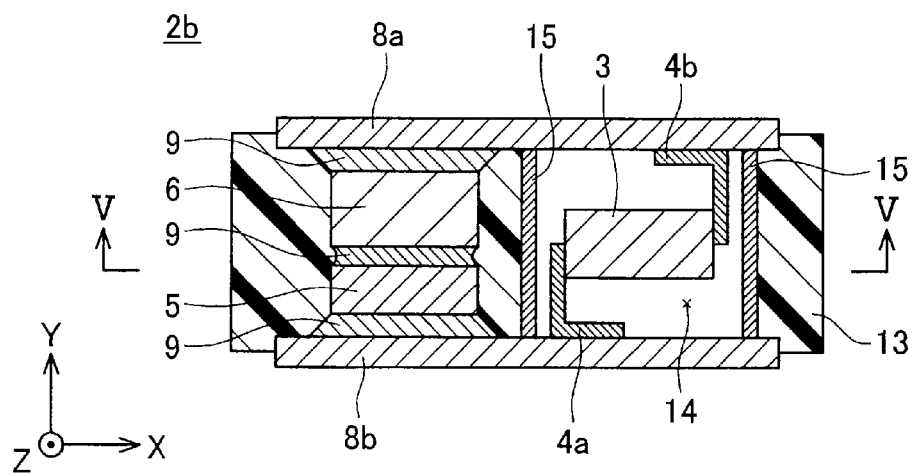
FIG. 4 is a sectional view of a semiconductor device in accordance with a third embodiment of the invention.
Figure 5:
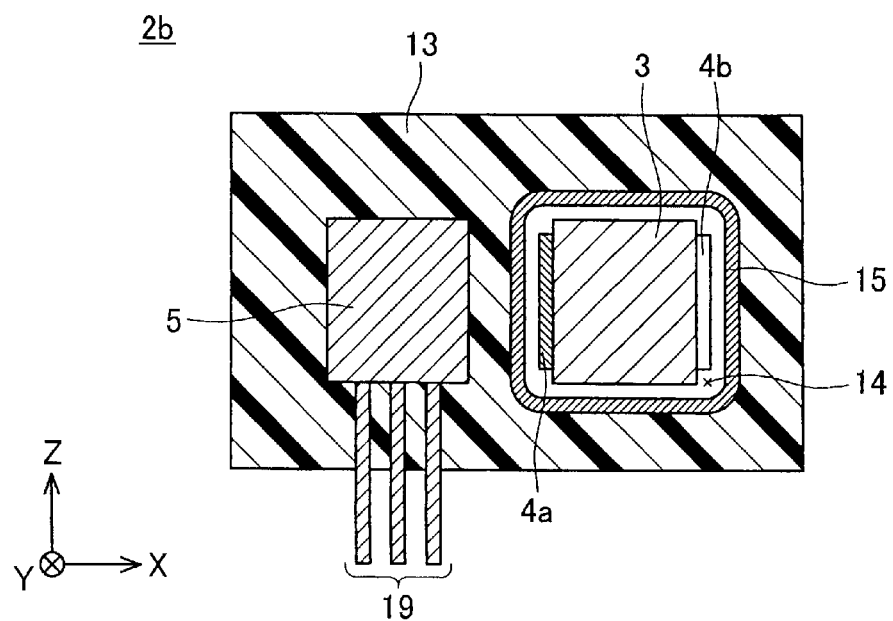
FIG. 5 is a sectional view taken in a plane as indicated by arrowed lines V, V of FIG. 4.

Next, a semiconductor device 2b of a third embodiment of the invention will be described. FIG. 4 is a sectional view of a semiconductor device 2b. The section shown in FIG. 4 corresponds to the section shown in FIG. 2. Furthermore, FIG. 5 is a sectional view taken in a plane indicated by arrowed lines V, V in FIG. 4. The sectional view in FIG. 5 is taken in a direction in which the lead frames 8a, 8b are layered.

In the semiconductor device 2b, a space 14 is secured around the capacitor 3. This space 14 is substantially formed by a tubular partition plate 15. Both ends of the partition plate 15, in the direction in which the lead frames 8a, 8b are stacked (the stacking direction of the lead frames 8a, 8b), are in contact with the two lead frames 8a, 8b, respectively. Furthermore, the partition plate 15 is disposed so as to surround the capacitor 3 or embrace the capacitor 3 therein in a view from the stacking direction of the lead frames 8a, 8b. That is, the partition plate 15, together with the lead frames 8a, 8b, isolates the space surrounding the capacitor 3 from a space outside the partition plate 15. The provision of the partition plate 15 prevents the space around the capacitor 3 from being filled with resin during injection molding.

The provision of the space 14 around the capacitor 3 allows the capacitor 3 to expand and shrink without receiving any restraint, except the restraint provided by the metal plates 4a, 4b. Therefore, the stress that occurs in the capacitor 3 due to expansion and shrinkage can be made substantially zero. Incidentally, since the transistor 5 is covered directly with the resin of the resin molding 13 as best shown in FIG. 4 and FIG. 5, the expansion and shrinkage of the transistor 5 due to heat is restrained and therefore the stress that occurs in the solder material 9 is restrained.

A structure of the semiconductor device 2b can be expressed as follows. The transistor 5 (a semiconductor element) and the capacitor 3 (a ceramic capacitor) are disposed between the two lead frames 8a, 8b. The transistor 5 and the capacitor 3 are electrically and physically connected in parallel with the two lead frames 8a, 8b. The lead frames 8a, 8b are in contact with two opposite surfaces of the semiconductor device 2b. In a view from the stacking direction of the lead frames 8a, 8b, the partition plate 15 surrounds a space surrounding the capacitor 3, and the space 14 is provided between the capacitor 3 and the partition plate. Between the two lead frames 8a, 8b, a space outside the partition plate 15 which contains the transistor is filled with a resin. This resin is the first resin and, typically, is an epoxy resin.

Points to note about the semiconductor devices 2, 2a and 2b described above in conjunction with the first to third embodiments are as follows. The capacitor 3 is covered with the low-rigidity resin 12 (see FIGS. 2 and 3), or is provided with the space 14 around the capacitor 3 (see FIG. 4). On the other hand, the transistor 5 is directly covered with the high-rigidity first resin 13. There is the low-rigidity resin 12 as a member that restricts the expansion of the capacitor 3 around the capacitor 3. Since the low-rigidity resin 12 is low in rigidity, the load that, when the capacitor 3 expands and shrinks, the capacitor 3 receives from the low-rigidity resin 12 is smaller than a load that, when the capacitor is covered with the first resin 13, the capacitor 3 receives from the first resin. Thus, the stress that occurs in the capacitor 3 is restrained. The term "stress is restrained" means that stress is restrained more than in the case where the capacitor 3 is covered directly with the first resin. The transistor 5 is covered directly with the first resin that is high in rigidity, and is restrained from expanding and shrinking. The expansion and shrinkage herein mainly refers to the expansion and shrinkage caused mainly by thermal expansion, that is, by heat. Since expansion and shrinkage of the transistor 5 is restrained, fatigue degradation of the solder material 9 that join the transistor 5 to the metal spacer 6 and the lead frames 8a, 8b and is restrained. In the semiconductor devices 2, 2a, 2b of the first, second and third embodiments, the transistor and the ceramic capacitor are covered with the resin molding 13. Therefore, the expansion and shrinkage of the transistor 5 is restrained to restrain the fatigue degradation of the solder material. On the other hand, as for the ceramic capacitor, the stress that occurs due to expansion and shrinkage of the ceramic capacitor is restrained, and therefore breakage of the ceramic capacitor is made less likely.

While the concrete examples of the invention have been described in detail, these examples are mere illustrations. The invention encompasses various modifications and alterations of the above-illustrated concrete examples. The technical elements described or illustrated in this specification or the drawings deliver technical usefulness individually or in various combinations. Furthermore, each of the technologies illustrated in this specification or the drawings can simultaneously achieve a plurality of objects, and any one of the technologies may be considered to have technical usefulness if the technology achieves one of the objects.

What is claimed is:

1. A semiconductor device comprising:
   a semiconductor element;
   a capacitor;
   a first resin that forms a resin molding which covers the semiconductor element and the capacitor; and
   lead frames that are attached to two surfaces of the resin molding and that are connected to the semiconductor element and the capacitor,
   a second resin that directly covers the capacitor and that has a rigidity lower than a rigidity of the first resin, wherein
   an outside of the second resin is directly covered with the first resin.

2. The semiconductor device according to claim 1, wherein the capacitor is a ceramic capacitor.

3. The semiconductor device according to claim 1, wherein the first resin is an epoxy resin, and
   the second resin is a resin selected from the group consisting of a silicon resin, a fluororesin and a polyvinyl chloride resin.

4. The semiconductor device according to claim 1, further comprising
   metal plates respectively fixed to the lead frames, wherein the capacitor is fixed to each of the metal plates,
   the second resin directly covers joining portions between the capacitor and the metal plates, and
   a portion of the second resin covering the capacitor is continuously connected to portions of the second resin covering the joining portions.

5. The semiconductor device according to claim 4, wherein the second resin is arranged apart from the lead frames.

6. The semiconductor device according to claim 1, further comprising
   metal plates respectively fixed to the lead frames,
   a solder material fixed to one of the lead frames, wherein the capacitor is fixed to each of the metal plates,
   the semiconductor element is fixed to the solder material, and
   the first resin is configured to directly cover the semiconductor element, portions of the lead frames and the solder material.

7. A semiconductor device comprising:
   a semiconductor element;
   a capacitor;
   a first resin that forms a resin molding which covers the semiconductor element and the capacitor; and
   lead frames that are attached to two surfaces of the resin molding and that are connected to the semiconductor element and the capacitor,
   wherein a space is defined between the first resin and the capacitor.

8. The semiconductor device according to claim 7, wherein the capacitor is a ceramic capacitor.

9. The semiconductor device according to claim 7, further comprising
   a partition plate that is disposed between the capacitor and the first resin in a view from a stacking direction of the lead frames, the partition plate having a tubular shape, wherein
   both end portions of the partition plate in the stacking direction are respectively in contact with the lead frames.

10. The semiconductor device according to claim 9, wherein
    the space is defined by the lead frames and the partition plate.

11. The semiconductor device according to claim 7, further comprising
    metal plates respectively fixed to the lead frames,
    a solder material fixed to one of the lead frames, wherein the capacitor is fixed to each of the metal plates,
    the semiconductor element is fixed to the solder material, and
    the first resin is configured to directly cover the semiconductor element, portions of the lead frames and the solder material.

12. A semiconductor device comprising:
    a semiconductor element;
    a capacitor;
    a first resin that forms a resin molding, the resin molding covering the semiconductor element and the capacitor and being apart from the capacitor; and
    lead frames that are attached to two surfaces of the resin molding and that are connected to the semiconductor element and the capacitor.

13. The semiconductor device according to claim 12, wherein
    the capacitor is a ceramic capacitor.

14. The semiconductor device according to claim 12, further comprising
    a partition plate that is disposed between the capacitor and the first resin in a view from a stacking direction of the lead frames, the partition plate having a tubular shape, wherein
    both end portions of the partition plate in the stacking direction are respectively in contact with the lead frames.

15. The semiconductor device according to claim 12, further comprising
    metal plates respectively fixed to the lead frames,
    a solder material fixed to one of the lead frames, wherein the capacitor is fixed to each of the metal plates,
    the semiconductor element is fixed to the solder material, and
    the first resin is configured to directly cover the semiconductor element, portions of the lead frames and the solder material.

* * * * *